United States Patent [19]
Higgins

[11] Patent Number: 5,521,518
[45] Date of Patent: May 28, 1996

[54] PROBE CARD APPARATUS

[76] Inventor: H. Dan Higgins, 323 E. Redfield, Chandler, Ariz. 85225

[21] Appl. No.: 775,914

[22] Filed: Oct. 15, 1991

Related U.S. Application Data

[63] Continuation-in-part of Ser. No. 585,939, Sep. 20, 1990, abandoned.

[51] Int. Cl.⁶ ..................................................... G01R 1/073
[52] U.S. Cl. ............................................ 324/754; 324/761
[58] Field of Search ........................... 324/158 P, 158 F, 324/72.5, 754, 761

[56] References Cited

U.S. PATENT DOCUMENTS

| 4,518,914 | 5/1985 | Okubo. | |
|---|---|---|---|
| 4,636,722 | 1/1987 | Ardezzone. | |
| 4,757,256 | 7/1988 | Whann et al.. | |
| 4,758,785 | 7/1988 | Rath. | |
| 4,891,585 | 1/1990 | Janko et al.. | |
| 4,899,099 | 2/1990 | Mendenhall et al.. | |
| 4,912,399 | 3/1990 | Greub. | |
| 4,918,383 | 4/1990 | Huff et al.. | |
| 4,968,589 | 11/1990 | Perry | 324/158 P |
| 4,975,638 | 12/1990 | Evans et al. | 324/158 P |
| 5,079,501 | 1/1992 | Miller et al. | 324/158 F |

FOREIGN PATENT DOCUMENTS

| 2571861 | 4/1986 | France | 324/158 F |
|---|---|---|---|

Primary Examiner—Ernest F. Karlsen
Attorney, Agent, or Firm—H. Gordon Shields

[57] ABSTRACT

Probe card apparatus includes a base element having a central cutout portion and an insert block is disposed in the cut out portion. A probe card secured to the base element includes a plurality of needle elements which contact electrical elements on an integrated circuit chip on a wafer being tested. The base element and probe card are secured to a printed circuit board. The insert contacts the needle elements and biases them against the electrical elements being tested. The insert block is positionable relative to the base element and to the needle elements, and the base element is positionable relative to the printed circuit board.

25 Claims, 4 Drawing Sheets

PROBE CARD APPARATUS

CROSS REFERENCE TO RELATED APPLICATION

This application is a Continuation-In-Part application of application Ser. No. 07/585,939, filed Sep. 20, 1990, now abandoned.

BACKGROUND OF THE INVENTION

1. Field of the Invention

This invention relates to the testing of integrated circuit chips on semi-conductor wafers and, more particularly, to apparatus for supporting a probe card during the testing of the integrated circuits.

2. Description of the Prior Art

Integrated circuits are formed as discrete chips on round semi-conductor wafers. The integrated circuit chips are tested prior to the cutting of the wafer. Typically, chips are tested by computer operated test apparatus that exercises the circuits on the chips.

A probe card is an element which includes a plurality of electrical leads, and the leads make contact with the various circuit elements on the integrated circuit chip being tested. In the prior art, it is typical for probe cards to be built by attaching metal needles to an epoxy ring. The needles or probe elements may be secured to the ring by epoxy or they may be bonded, as by welding, to a blade. The needles are individually placed on the desired electrical elements of the chips for testing.

U.S. Pat. No. 3,849,728 (Evans) discloses a probe card for testing integrated circuit patterns. The apparatus includes a plurality of needles secured to needle holders, and the needle holders are in turn secured to conductive elements on a printed circuit board. The elements are all fixed relative to each other.

U.S. Pat. No. 3,939,414 (Roch) discloses an integrated circuit testing apparatus in which a test probe assembly includes elements for the precise location of a test probe both axially and vertically.

U.S. Pat. No. 4,161,692 (Tarzwell) discloses another type of probe device with probe needles secured to holder elements. The patent is primarily directed to the holder elements for the probe needles.

U.S. Pat. No. 4,518,914 (Okubo et al) discloses test probe apparatus which includes a probe card and needles extending outwardly and downwardly from the probe card. The probe card is secured to a base plate by vacuum pressure.

U.S. Pat. No. 4,636,722 (Ardezzone) discloses test probe apparatus which includes a cutout portion and an element disposed in the cutout portion adjacent to a probe assembly. The cutout portion of the Ardezzone patent actually includes two "inserts" one of which is disposed on the top of the apparatus and extends into the cutout portion, and the second is the one referred to above, that is secured to the bottom of the cutout portion and makes contact with the probe assembly.

U.S. Pat. No. 4,757,256 (Whann et al) discloses an epoxy ring probe card apparatus in which a plurality of probe elements are secured to conductive traces on the epoxy ring.

U.S. Pat. No. 4,758,785 (Rath) discloses integrated circuit testing apparatus in which a probe card includes a plurality of probe elements and a pressure pad disposed against the probe and secured to support structure by resilient attaching elements to provide vertical movement of the pressure pad relative to the probe for providing a desired pressure of the probe against an integrated circuit to be tested.

U.S. Pat. No. 4,764,723 (Strid) discloses another type of probe apparatus. The '723 apparatus is primarily directed to electrical connections involved.

U.S. Pat. No. 4,791,363 (Logan) discloses another type of probe needle apparatus. The probe needle apparatus includes a ceramic body, with a microstrip circuit element on one side of the ceramic body and a ground plane on the other side of the ceramic body. The probe apparatus of the '363 patent is designed primarily for frequencies in the Gigahertz range.

U.S. Pat. No. 4,891,585 (Janko et al) discloses another type of probe apparatus in which pressure contacts are made between the probe card apparatus and circuit elements on a wafer being tested.

U.S. Pat. No. 4,899,099 (Mendenhall et al) which includes what is referred to as a flex dot wafer probe. The '099 apparatus appears to use thin film technology.

U.S. Pat. No. 4,906,920 (Huff et al) discloses a self-leveling membrane probe apparatus. The apparatus includes another carrier element and translation means disposed in a relatively movable relationship to the carrier. Spring elements secure the carrier in the translation elements together.

U.S. Pat. No. 4,912,399 (Greub et al) discloses another type of probe apparatus. The probe apparatus uses contact elements on the bottom of a support member, and the support member is used to provide a pressure contact between the contact elements and the circuit elements under test.

U.S. Pat. No. 4,918,383 (Huff et al) discloses probe card apparatus with an automatic contact scrub action. The automatic scrub action is accomplished by using fixed length and variable length flexure assemblies. The combination of fixed and variable length pivot assemblies results in a lateral or sideways movement of probe contact elements which provides an automatic scrubbing action of the contact element against the device under test.

The apparatus of the present invention utilizes individual needles on a probe card, and the needles are bent downwardly at an angular orientation from the horizontal to provide a scrubbing action on the integrated circuit elements as the needles make contact with the integrated circuit. The scrubbing action provides a cleaning for insuring that good electrical contact is made between the needles of the probe card and the circuit elements. The needles comprise continuation of conductive traces on a probe card dielectric substrate.

The probe card of the present apparatus is secured to a probe card holder that includes a movable or adjustable element which makes contact with the probe card. A dielectric block insert in the probe card bolder is adjustable to provide a desired force on the probe card needles.

SUMMARY OF THE INVENTION

Invention described and claimed herein includes a probe card and a holder for the probe card. The probe card includes a dielectric element on which a plurality of needles and needle circuit elements are etched by photolithography processes. The needles extend downwardly from the dielectric material at a typical angular orientation of between 7 and 10 degrees from the horizontal, but which may vary from zero degrees to about 45 degrees, to provide a scrubbing action on the electrical circuit elements of the integrated circuit when the probe card is moved downwardly to contact the circuit elements. The needles are integral with, and comprise continuations of, the needle circuit elements etched on the dielectric element.

The probe card is secured to a base element or holder, and the holder includes a dielectric block insert which makes contact with the needles. The dielectric block includes a tapered edge portion which acts as a fulcrum for the needles. The dielectric block insert is adjustable and is spring loaded for varying the force against the probe card and against the needles thereon.

Among the object of the present are the following:

To provide new and useful probe card apparatus;

To provide new and useful apparatus for testing integrated circuit chips;

To provide new and useful probe card apparatus having a plurality of probe needles which contact circuit elements on an integrated circuit;

To provide new and useful probe card apparatus having a plurality of needles bent at an angle to the horizontal to provide a scrubbing action as the needles contact electrical circuit elements;

To provide new and useful probe card apparatus in which probe needles comprise continuations of circuit elements etched on a dielectric substrate;

To provide new and useful apparatus for holding a probe card;

To provide new and useful probe card holder apparatus having a movable insert; and To provide new and useful probe card apparatus including a probe card and a holder for the probe card.

DESCRIPTION OF THE PREFERRED EMBODIMENT

Figure 1:
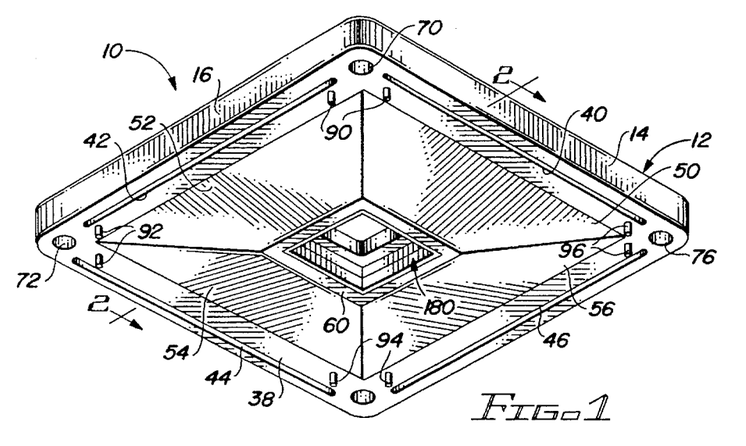
FIG. 1 is a perspective view of a portion of the apparatus of the present invention.
Figure 2:
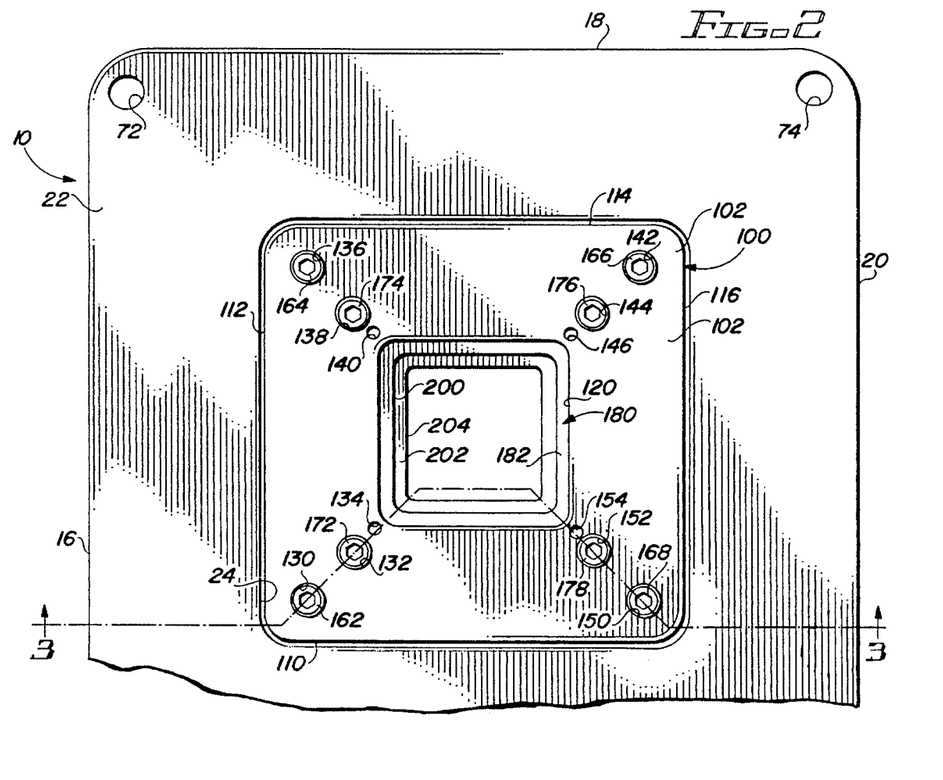
FIG. 2 is a top plan view of a portion of the apparatus of the present invention.
Figure 3:
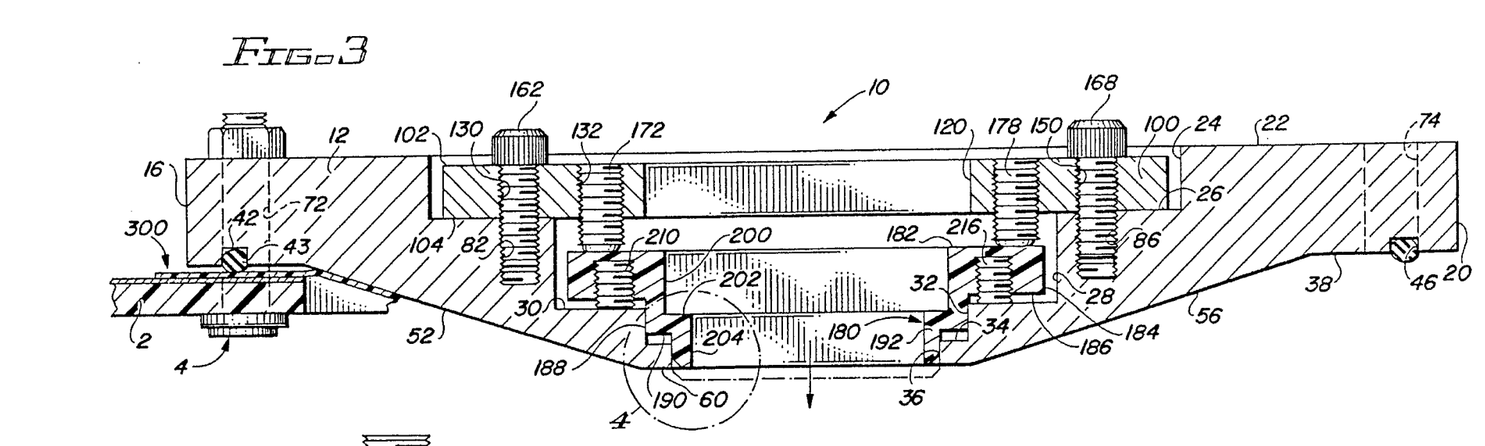
FIG. 3 is a view in partial section of the apparatus taken generally along line 3—3 of FIG. 2.

FIG. 1 is a bottom perspective view of a portion of the apparatus of the present invention, comprising a membrane support assembly or probe card apparatus 10. FIG. 2 is a top view of a portion of the membrane support assembly 10. FIG. 3 is view in partial section of the membrane support assembly 10 taken generally along line 3—3 of FIG. 2. The membrane support assembly 10 includes a base element 12 and an insert 180. Both elements are illustrated in FIGS. 1, 2, and 3.

Figure 4:
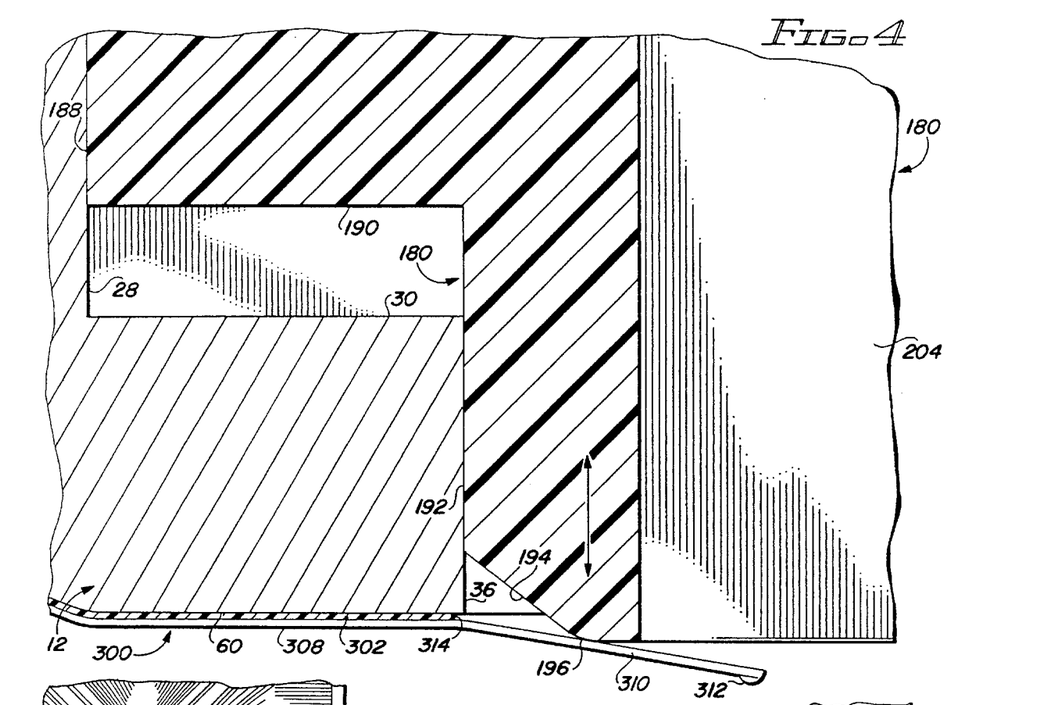
FIG. 4 is an enlarged view in partial section taken generally from Circle 4 of FIG. 3.

FIG. 4 is an enlarged view in partial section of portions of the base element 12 and the insert 180 taken generally from Circle 4 of FIG. 3. For the following discussion of the membrane support assembly 10, reference will primarily be made to FIGS. 1, 2, 3, and 4.

The base element 12 of the membrane support assembly 10 includes four sides, including a side 14, a side 16, a side 18, and a side 20. The four sides define a generally square base element. The base element 12 also includes a planar top 22. The sides 14 . . . 20 are generally perpendicular to the planar top 22, The sides are conveniently rounded at the juncture of adjacent sides, which comprise the corners of the base element 12.

Extending downwardly through the base element 12 from the top 22 is a series of stepped cutouts. The top cutout is a cutout 24. The cutout 24 is illustrated as square, but its configuration, and the configuration of all of the cutouts, will conform to the configuration of the chips being tested. Thus, the cutout 24 will be square for testing a square chip, rectangular for testing a rectangular chip, etc.

The cutout 24 extends downwardly to a generally horizontally extending and inwardly directed shoulder 28. Extending downwardly from the inner portion of the shoulder 26 is an intermediate cutout 28. The cutout 28 extends vertically downwardly to a shoulder 30. The shoulder 30 extends inwardly from the cutout 28 to a lower cutout 32. At the bottom portion of the cutout 32 is an inwardly directed shoulder 34.

From the interior of the shoulder 34 there is an inner or bottom cutout 36. The cutout 36 extends downwardly to a bottom inner flat surface 60 which extends outwardly from the cutout 36.

Extending inwardly from the four sides 14, 16, 18, and 20 is a bottom outer flat surface 38. Extending upwardly into the bottom outer flat surface 38 are four slots. The four slots are adjacent and generally parallel to the respective four sides. The slots include a slot 40 which is generally parallel to the side 14, a slot 42 which is generally parallel to side 16, a slot 44 which is generally parallel to the side 18, and a slot 46 which is generally parallel to the side 20. The slots receive resilient pressure contacts elements. A resilient element 43 is shown in FIG. 3 in slot 42.

Extending inwardly and downwardly from the bottom outer flat surface 38 are four tapered surfaces. Each of the tapered surfaces is in the general configuration of a trapezoid, with the non-parallel sides having equal lengths. The tapered surfaces include a tapered surface 50, a tapered surface 52, a tapered surface 54, and a tapered surface 56. The tapered surfaces extend inwardly from the outer flat surface 38 to the inner flat surface 60. The inner flat surface 80 is disposed between the tapered surfaces and the bottom cut out 36.

The inner of bottom flat surface 60 is generally parallel to the top planar surface 22, and to the outer planar surface 38.

There are four apertures at the four corners of the base element 12 adjacent to the outer sides. The four apertures include an aperture 70 adjacent to the juncture of the sides 14 and 16, an aperture 72 adjacent to the juncture of the sides 16 and 18, an aperture 74 adjacent to the juncture or corner of the sides 18 and 20, and an aperture 76 adjacent to the juncture or corner of the sides 20 and 14.

The apertures 70, 72, 74, and 76 receive fastening elements, such as screws, to secure the base element 12 and a probe card or membrane card to a printed circuit board in the use environment. In FIG. 3, a portion of a printed circuit board 2 is shown secured to the base element 12 and a probe card 300 by a screw assembly 4. The screw assembly 4 includes a ring or washer or the like, a screw which extends through the aperture 72, and a nut.

Extending downwardly from the shoulder 26 are four tapped apertures. Two of the tapped apertures are shown in FIG. 3. The two tapped apertures shown in FIG. 3 include an aperture 82 and an aperture 86. The tapered apertures will be discussed in more detail below.

Extending downwardly from the bottom outer flat surface 38 are four pairs of pins. The four pairs of pins include a pair of pins 90, a pair of pins 92, a pair of pins 94, and a pair of pins 96. The pairs of pins 90 . . . 96 are used to help index the membrane or probe card 300 to the base 12 and to help index or align the card 300 to the printed circuit board 2 in order to insure correct electrical contact and alignment between electrical contact elements on both the circuit board 2 and the card 300. Obviously, the board 2 will have apertures (not shown) to receive the pin pairs from the element 10. This will be discussed in more detail below.

A top plate 100 is disposed in the cutout 24 and rests on the shoulder 26. The top plate 100 has a configuration to appropriately match that of the cutout 24. The overall height or thickness of the plate 100 is about the same as the overall depth of the cutout 24. This is best illustrated in FIG. 3.

The top plate 100 includes a top surface 102 and a bottom surface 104. The bottom surface 104 is disposed on the shoulder 26. The top plate 100 includes four sides 110, 112, 114, and 116. The four sides are spaced inwardly a relatively slight amount from the sides of the cutout 24 in which the plate 100 is disposed.

As best shown in FIG. 2, the four corners of the plate 100, or the junctures of adjacent sides, are gently rounded, as are the corners of the cutout 24. Spaced inwardly from the rounded corners of the plate 100 are four apertures. The apertures receive cap screws which secure the plate 100 within the cutout 24 to the base element 12. An aperture 130 is shown in FIG. 3 aligned with the tapped aperture 82 in the base element 12. A cap screw 162 is shown extending through the aperture 130 and into the tapped aperture 82. A second aperture 150 is shown in FIG. 3 aligned with the tapped aperture 86 in the base element 12. A cap screw 168 is shown extending through the aperture 150 and into the tapped aperture 86. In addition to the cap screws 162 and 168, shown in both FIGS. 2 and 3, two other cap screws, a cap screw 164 and a cap screw 166, are shown in FIG. 2, extending through apertures 136 and 142, respectively.

There are other apertures extending through the plate 100 for other purposes. There are generally three apertures aligned from each of the corners inwardly, as best shown in FIG. 2. The apertures include an aperture 132 and an aperture 134 which extend inwardly and are aligned with the aperture 130 from the corner which comprises the juncture of the sides 110 and 112.

A pair of apertures 138 and 140 extend inwardly from the aperture 136 in which the cap screw 164 is illustrated, and which three apertures are aligned inwardly from the corner which defines a juncture of the sides 112 and 114.

Three apertures extend inwardly from the corner which defines the juncture of sides 114 and 116. They include an aperture 142 through which the cap screw 166 extends, and they also include an aperture 144 and an aperture 146. Similarly, three apertures extend inwardly from the corner which defines the juncture of the sides 116 and 110. They include the aperture 150 (see FIG. 3) and an aperture 152 and an aperture 154.

The apertures 132, 138, 144, and 152 are tapped. The four tapped apertures receive set screws which include spring loaded balls on the bottom of the set screws. Two of the set screws are shown in FIG. 3. The tops of the four set screws are also shown in FIG. 2. They include a set screw 172 in the aperture 132, a set screw 174 in the aperture 138, a set screw 176 in the aperture 144, and a set screw 178 in the aperture 152.

The set screws 172 . . . 178 are adjustable in their respective tapped apertures, as will be discussed in detail below.

The inner apertures 134, 140, 146, 154 provide communication through the plate 100 to elements on the insert 180, as will be discussed in detail below.

Disposed beneath the plate 100 and within the cutout 128 in the base element 12 is the dielectric insert 180. The dielectric insert 180 is generally of a square configuration, but having a stepped outer configuration. The stepped configuration includes both internal and external, or inside and outside, steps. The overall configuration of the insert 180 will, of course, conform to that of the cutouts 28 and 36, which in turn conform to the configuration of the cutout 24. Details of the dielectric insert or block 180 are shown in both FIGS. 3 and 4.

The dielectric insert 180 includes a top surface 182 and four upper sides defined by an outer periphery 184. Extending inwardly from the lower portion of the outer periphery 184 is an upper bottom shoulder 186. The bottom shoulder 186 is disposed above the bottom or shoulder 30 on the base element 12.

Extending downwardly from the bottom shoulder or surface 186 is another downwardly extending portion defined by an outer periphery 188. Extending inwardly from the bottom of the downwardly extending peripheral surface 188 is an inwardly extending shoulder 190. The inwardly extending shoulder 190 is a bottom shoulder. It is disposed above shoulder 34 of the base element 12.

Extending downwardly from the inner termination of the shoulder 190 is a downwardly extending portion 192.

From the bottom of the downwardly extending portion 192 is a tapering or tapered portion 194. The tapered portion 194 terminates in a bottom fulcrum 198.

The interior of the dielectric insert 180 includes an upper cut out 200. The cutout 200 is generally parallel to the outer peripheral surface 184 of the insert 180. Extending inwardly from the bottom of the cutout 200 is an inner peripheral shoulder 202. Extending downwardly from the inner peripheral shoulder 202 is a lower cut out 204.

As may be seen from FIGS. 1, 2, and 3, the upper cutout 200 and the lower cut out 204 provide visual communication through the center of the apparatus 10 to allow visual alignment of the apparatus 10 with the integrated circuit elements that are to be tested on a wafer or chip disposed beneath of apparatus 10.

There are four inner tapped apertures which extend through the upper portion of the insert 180. The apertures are disposed inwardly from the four corners, or adjacent to the four corners of the outer periphery 184. The tapped apertures extend between the top surface 182 and the upper bottom shoulder 186. Set screws are disposed in the tapped apertures. Two of the set screws are shown in FIG. 3. The two set screws shown in FIG. 3 include a set screw 210 and a set screw 216.

The four inner set screws, including the set screws 210 and 216, are adjusted through the inner apertures 134, 140, 146 and 154 in the top plate 100. The adjustment of the four inner set screws, including the set screws 210 and 216, determines the initial location of the fulcrum 196 (see FIG. 4) beneath the bottom surface 60 of the base element 12.

The location or vertical placement of the set screws 172 . . . 178 determines the upper limit, or the allowable movement, of the insert 180. Since the set screws 172 . . . 178 include spring loaded balls on or at their bottoms, and the spring loaded balls bear against the top surface 182 of the insert 180, it is obvious that upward pressure or force on the dielectric insert 180 may move the insert 180 upwardly until the spring loaded balls bottom out against the fixed portions of their respective set screws.

By use of the spring loaded set screws 172 . . . 178 which are secured in the top plate 100 and the use of the inner set screws in the insert 180, it is obvious that the insert 180 may be adjusted in any manner desired. It may be canted at any certain orientation, it may be level with respect to the appropriate surfaces of the base element 12, or it may be tilted in any particular direction, etc. Moreover, the adjustment of the set screws 172 . . . 178 with the spring loaded balls allows movement of the insert 180 up to a predetermined amount without damage to any of the elements involved. This will be discussed in detail below in conjunction with the membrane card or probe card 300 best illustrated in FIGS. 5 and 6 and as shown in its use environment in FIG. 4.

Referring again to FIG. 3, it will be noted that the apparatus 10, with the insert 180 and the card 300, may also be adjusted relative to the board 2 by varying the force or pressure against the resilient inserts in the slots 40 . . . 46, such as against the insert 43 in the slot 42 and against the insert, not shown, in the slot 44 by means of the screw assembly 4. The force or pressure against the other inserts in the other slots adjacent to the corners is adjusted by similar screw assemblies.

The initial planarity of the base element 10 and the card 300, with respect to the board 2, is adjusted by the screw assemblies at the four corner apertures 70 . . . 76 of the base 12 and the mating and aligned apertures in the card 300 and the board 2. As indicated above, the insert 180 may also be separately or independently adjusted relative to the base element 12 by the various set screws discussed.

Figures 5, 6, 7:
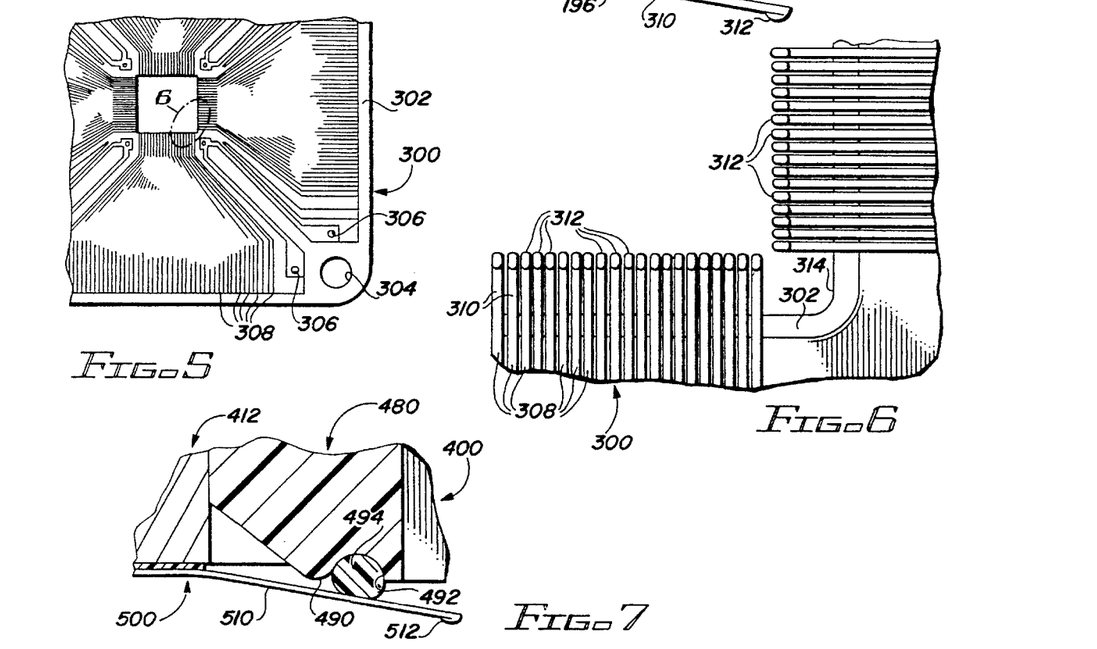
FIG. 5 is a plan view of a portion of the apparatus of the present invention.
FIG. 6 is an enlarged view of a portion of the apparatus of FIG. 5, taken generally from Oval 6 of FIG. 5.
FIG. 7 is an enlarged view in partial section of a portion of an alternate embodiment of the apparatus of the present invention.

FIG. 5 is a top view of a portion of the membrane test card or probe card 300 usable with the base element 12 and the insert 180 as discussed above. FIG. 6 is an enlarged view of a portion of the card 300 taken generally from Oval 6 of FIG. 5. For the following discussion, reference will primarily be made to FIGS. 5 and 6. Additional reference will also be made to FIG. 4 and to other figures as required.

The membrane or probe card 300 includes a flexible dielectric substrate or membrane 302 containing a plurality of metallic conductive traces 308. The traces 308 may be fabricated either through photolithography processes, well known and understood in the art, or they may be plated up to a desired thickness by plating or deposition techniques also well known and understood in the art.

The membrane card 300 is generally square in configuration, conforming to the general configuration of the base 12. For aligning the card 300 to the base 12, there are a number of apertures. An aperture 304 is shown adjacent to a corner of the card. The aperture 304 will be aligned with one of the four corner apertures 70 . . . 76 of the base 12. Spaced inwardly from the aperture 304 is a pair of index apertures 306. The index apertures 306 receive a pair of indexing pins, such as one of the pin pairs 90 . . . 96, shown in FIG. 1.

The metallic traces 308 terminate inwardly in a plurality of needles 310. It is the needles 310 that actually make contact with the electrical elements on the integrated circuits on a wafer for test purposes. The needles 310 extend inwardly from a center cutout 314 of the substrate 302. The needles 310 are simply continuations of the traces 308. No separate needle elements are required.

Outwardly the traces 308 make electrical contact with corresponding traces 3 on the printed circuit board 2 when the apparatus 10 is secured to the circuit board 2, as discussed above. This is illustrated in FIG. 3.

The center cutout 314 is a squarely configured cutout which is generally aligned with the inner or bottom cutout 36 of the base element 12 and the bottom cutout 204 of the insert 180. The center cutout 314 allows for the visual alignment of the needles 310 with the integrated circuit elements being tested.

The needles or contact elements 310, extending inwardly from the cutout 314, are bent downwardly at an acute angle from the plane of the substrate 302 of typically about 10 degrees, but the angle may vary, as indicated above. As best shown in FIG. 4, the fulcrum 196 of the dielectric block insert 180 makes contact with the needles. The fulcrum 196 of the insert 180 provides a positive downward bias for the needles 310.

The card 300 is preferably adhesively secured to the base 12. Of particular concern is the securing of the portion of the card disposed out or against the surface 60 of the base 12. If the substrate or membrane 302 separates from the surface 60, the orientation or angular orientation of the needles 310 against the chip being tested may be affected. It is desirable that the angle of the needles on the chip being tested and the force on the needles and on the chip be and remain as intended. If the card 300 separates from the base 12 in the area of the surface 60, both the angle and the force may change or vary from the intended.

In FIG. 4 and in FIG. 6 there are shown bumps or tips 312 at the outer extremities of the needles 310. The tips 312 are plated up portions at the outer end of the needles for making contact with the circuit elements on a wafer being tested. The plated up tips may or may not be used, as desired.

Referring primarily to FIGS. 3 and 4, it will be understood, as discussed above, that the location of the dielectric block 180 in relation to the base 12 and to the tips 312 will be important in making contact with the circuit elements of a wafer being tested. The vertical location of the insert 180 may vary the angular orientation with needles 310 with respect to the bottom 60 of the base element 12.

Referring again to FIG. 3, a chuck 6 is shown with a wafer 8 disposed on the top of the chuck. The wafer 8 contains a plurality of integrated circuits to be tested.

The chuck 6 is secured to an X-Y table that indexes the wafer 8, and the circuits on the wafer 8, below the needles 310 of the apparatus 10 for testing. The chuck moves vertically upwardly to provide contact between the needles 310 and the circuit elements on the wafer's integrated circuits. After testing, the chuck 6 moves downwardly, indexes to a new location to locate a new integrated circuit beneath the needles 310, and then moves upwardly to again make the connections or contacts between the needles and the circuit elements for testing.

As a wafer moves upwardly beneath the apparatus 10, the needles 310, or the outer ends of the needles, such as tips 312, make contact with the integrated circuit elements on the wafer. The angular orientation of the needles 196 causes a scrubbing action at the outer end of the needle as the wafer moves upwardly to contact the needles 310. The scrubbing action insures good contact by wiping away any impurities or oxidation or the like that may occur on both the needles 310 and the circuit elements of the wafer being tested. Accordingly, good electrical connection is virtually assured between the needles 310 of the membrane card 300 and the circuit elements of the integrated circuits on a wafer being tested by the scrub or wiping action.

It will also be noted that, with the open center areas of the membrane card 300, the insert 180, the plate 100 and the base element 12, the needles 310, which extend into the center open area, may be visually aligned with the circuit elements being tested. The visual alignment helps to insure good electrical contact, or proper electrical contact, for expediting the testing of the integrated circuit elements on the wafer indexed beneath the apparatus 10.

It will also be noted that, with the base element 12 being made of metal, the base element may serve as a ground plane, thus obviating a separate electrical ground plane element on the membrane card 300. Moreover, the element 12 may be used as a power distribution element, etc.

If desired, it is also obvious that a membrane card may have multiple layers to provide additional contacts, if such are desired. However, only a single layered membrane card 300 is illustrated.

Returning again to FIG. 4, it will be noted that with an insert 180 having a different inwardly tapered surface 194 and a different location of the fulcrum 196, the extent of the scrub of the needle 310 may be changed or varied. Thus, as discussed above, the location of the fulcrum 196 and the vertical plane, with respect to the needles 310 and the bottom 60 of the base element 12, may be varied. Moreover, the use of a different insert, or of an insert block having a different fulcrum point 196, will also vary the angular orientation of the needle 310 and accordingly will alter the scrub of the needle 310 on the electrical elements being tested.

Returning again to FIGS. 1, 2, and 3, it will be noted that the base element 12 is easily separated into its component parts for repair, replacement, or the like. Moreover, it will be understood that the membrane card 300 is easily secured to and removed from the base 12 and that the indexing of the membrane card 300 to the base 12 is easily and accurately accomplished.

While the card 300 is preferably adhesively secured to the base 12, the two are still relatively easily separated for repair, replacement, etc. The card 300 and the base 12 are not secured together in a "permanent" relationship. Rather, the card 300 is releasably secured to the base 12 for ease of replacement, etc., as discussed above.

As has been referred to in detail above, the central open areas of the base 12, the plate 100, the insert 180, and the membrane card 300 allow for the visual alignment of the various needles 310 of the card 300 to the electrical elements on a chip being tested. Moreover, with the accessibility of the various cap screws and set screws, and the like, it will be understood that various adjustments of the insert 180, and accordingly of the needles 310 of the membrane card 300, may be easily accomplished.

FIG. 7 is an enlarged view of an alternate embodiment of a portion of the apparatus of the present invention, namely an alternate embodiment apparatus 400 which utilizes a slightly different configuration of an insert 480 within a base element 412. The insert 480, is preferably a dielectric block insert. It includes a fulcrum 490 and a groove 492 extending through the fulcrum 490. A resilient element 494 is disposed within the groove 492.

A probe card or membrane card 500 is shown disposed beneath the insert 480. The probe card 500 included a plurality of inwardly extending needle elements 510. The resilient element 494 is shown disposed against a needle 510. The resilient element 494 applies a positive but resilient bias on the needle 510 to bias the needle 510 against a wafer being tested.

In comparing the needle 510 of FIG. 7 with the needle 310 of FIG. 4, it will be noted that the needle 510 is substantially shorter. Accordingly, a substantially greater force than that used with the apparatus 10 may be applied through the resilient element 494 against the needle 510 to insure a positive contact with circuit elements being tested on a wafer.

The needle 510 includes a tip 512, and the tip 512 is disposed relatively close to the resilient element 494 in the groove 492 of the fulcrum 490. Since the substantially greater force may be applied to the needle 510 than may be applied to the needle 310, the tip 512 is appropriately positioned much closer to the area in which the pressure from the dielectric insert 480 is applied.

The application of greater pressure in the apparatus 400 will be accompanied by a relatively lesser amount of scrub, or longitudinal movement of the tip 512, on the circuit being tested. However, at the same time, a greater downward force on the needle 510 will provide sufficient force to insure good electrical contact through whatever impurities, oxidation, or the like, may be encountered between the tip 512 and the electronic element on the chip or wafer being tested.

In both the apparatus 10 and the apparatus 400, the insert blocks 180 and 480 have been referred to as dielectric blocks. It will be understood that the blocks need not be made of dielectric material, so long as the fulcrum or portion of the insert which contacts the needles is nonconductive to prevent the needles from being short circuited.

Figure 8:
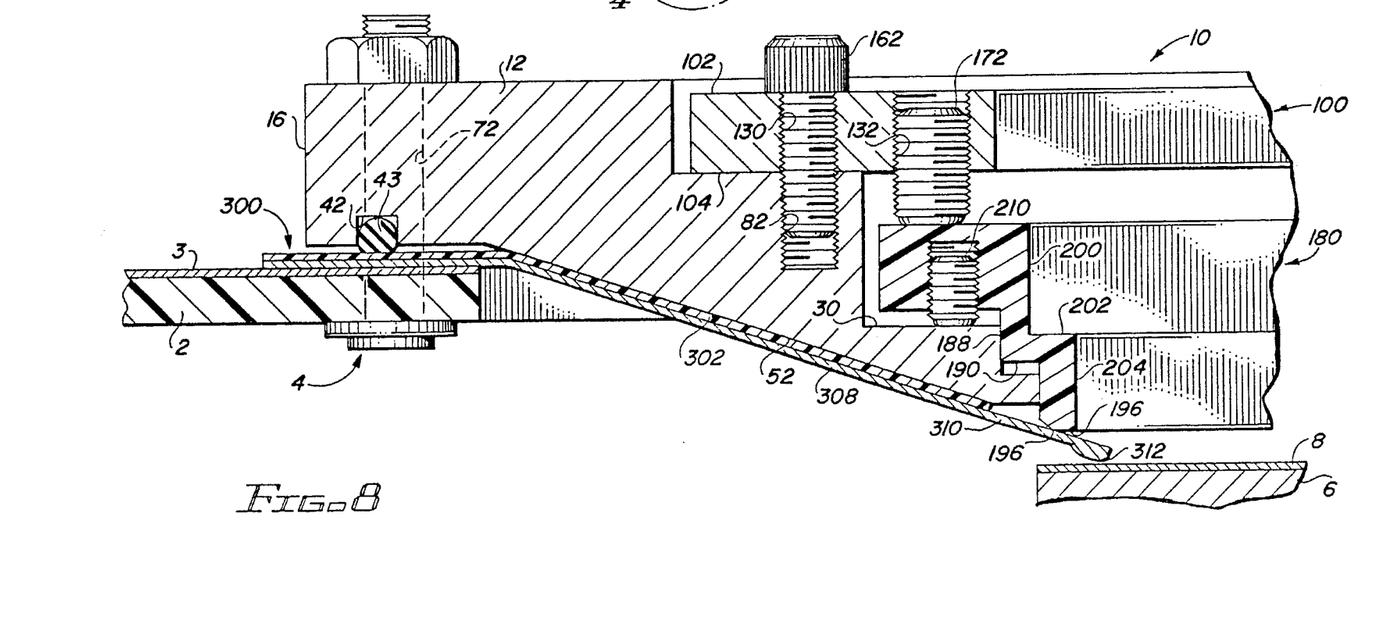
FIG. 8 is an enlarged view in partial section of a portion of the apparatus of the present invention in its use environment.

FIG. 8 is an enlarged view in partial section of a portion of the apparatus of the present invention, such as illustrated in FIG. 3, showing the apparatus 10 in its use environment. As indicated previously, primarily in conjunction with FIG. 3, the apparatus 10 is disposed on and secured to a printed circuit board 2. The printed circuit board 2 includes a plurality of electrical circuit elements 3 which make contact with the metallic traces or conductive traces 308 on the membrane card 300. In turn, the metallic traces 308 terminate in needles 310 which extend over the open areas of the base element 3, the top plate 100, and the insert 180.

Disposed beneath the apparatus 10 and the printed circuit board 2 is a movable chuck 8 on which is disposed a wafer 8. The wafer 8, as discussed above, includes a plurality of integrated circuit elements thereon, each of which includes a plurality of circuit elements. The tip 312 of the needle 310, makes contact with the circuit elements on the wafer 8. It is the circuit elements on the wafer 8 that are to be tested by the apparatus 10 and the printed circuit board 2.

The chuck 6 is secured to an X-Y table which moves both vertically, or in the Z plane, as well as indexing in the X-Y directions. Accordingly, as the circuit elements on a particular integrated circuit portion on the wafer 8 are appropriately tested, the chuck 6 is moved to index another integrated circuit portion, with its elements to be tested, beneath the apparatus 10 and beneath the needles 310.

As indicated above, the apparatus 10 is secured to the printed circuit board 2 by the four screw assemblies 4 at the corners of the base element 12. Once the base element 12 is free from the integrated circuit board 2, a probe card 300 may be easily removed from the base element 12 and replaced with another probe card, or the probe card may be easily repaired and then returned to the base element 12. The base element 12, with the card 300, may then be again secured to the printed circuit board 2.

The adjustment of the insert 180 with respect to the needles 310 of the probe card may be appropriately accomplished for the particular demands of the electrical elements being tested on the wafer 8. This is accomplished, as discussed above, by the adjustment of the screws 210 . . . 216 and the adjustment of the screws 172 . . . 178. Moreover, the initial planarity of the apparatus 10 may be adjusted by the screw assemblies 4 by varying the pressure of the resilient gasket elements, such as the element 43 shown in the slot 42. Other adjustments in the planarity, or otherwise, may also be made through the screws 172 . . . 178 and the screws 210 . . . 218, as desired or as required.

Figure 9:
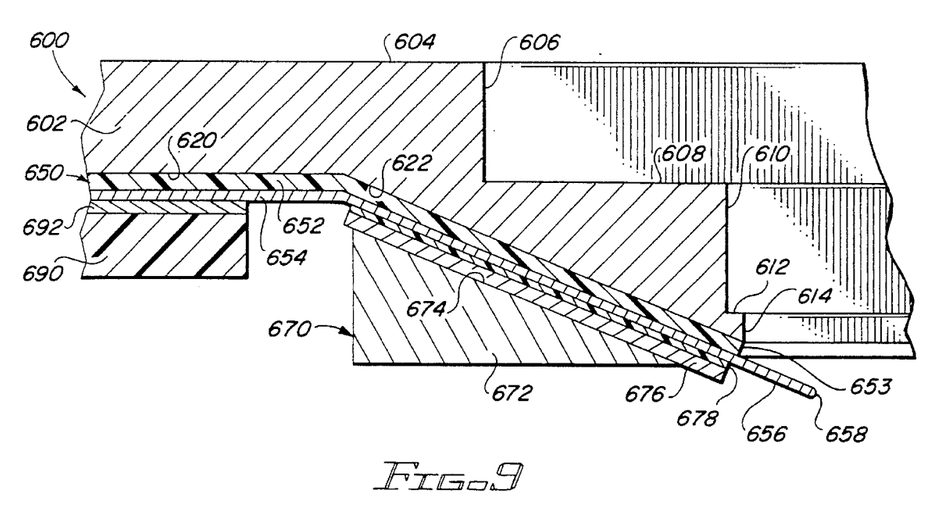
FIG. 9 is an enlarged view in partial section of a portion of another embodiment of the apparatus of the present invention.

FIG. 9 is an enlarged view in partial section of an alternate embodiment 600 of the apparatus of the present invention. The apparatus 600 differs primarily from the embodiments of FIGS. 1–8 in that there is no insert in the central cutout portions of the apparatus. Rather, forces applied on a membrane card through a sloping portion of a base element, and the membrane card is held in place by a clamp. As in the other embodiments of the membrane card, the needles or tips comprise continuations of the conductive traces on a dielectric substrate.

The alternate embodiment apparatus 800 includes a base element 602, a membrane card 650 secured to the base element 602, and a printed circuit board 690 which in turn is appropriately secured to the base element 602 and the membrane card 650. The base element 602 includes a top surface 604 and three cutout portions mixed into the base element 602 from the top surface 604. There is a top cutout portion 606, a middle cutout portion 610, and a lower or bottom cutout portion 614, A shoulder 608 extends between the cutout 606 and the cutout 610. A shoulder 612 extends between the cutout 610 and the cutout 614. The shoulder 608 and 612 are an generally parallel to top surface 604. The cutout portion 606, 610 and 614 are generally perpendicular to the shoulders and to the top surface. The cutouts 606, 610, and 614 are generally "coaxial" with respect to each other and they are disposed generally centrally within the base element 602.

At the outer periphery of the base element 602 there is a bottom flat surface 620. The surface 620 is generally parallel to the top surface 604. Extending inwardly and downwardly from the outer bottom flat surface 620 is a tapering or sloping surface 622. The surface 622 extends between the surface 620 and the bottom cutout 614.

The membrane card 650 is appropriately disposed against and secured to the surfaces 620 and 822. The membrane card 650 includes a dielectric substrate 652, which is disposed against the surfaces 620 and 622, and a plurality of conductive traces 654 are appropriately bonded to the substrate 652. Only one such trace is, of course, shown in FIG. 9.

The dielectric substrate 652 includes a cutout 653 generally adjacent to the juncture of the sloping surface 622 and the cutout 614. The cutout 653 is aligned with the cutout portions of the base element 602 for the visual alignment of the needles which extend from the traces 654 and the integrated circuit under test. This is substantially the same as discussed above for the other embodiments of the present invention.

Each conductive trace 654 continues on downwardly and outwardly from the cutout 653 of the substrate 654 in a needle 656. That is, as in the above discussed membrane cards, the needle 656 comprises a continuation of the conductive trace 654. The difference between needle 656 and the conductive trace 654 is essentially the "termination" or "end" 653 of the dielectric substrate 652. The needle 656 terminates in a tip 658. If desired, the tip 658 may include a plated on thickened tip portion, such as shown in FIGS. 4, 7, and 8, to help insure good electrical contact between the needle 656 and a circuit element under test. However, such a thickened tip or bottom bump may not be necessary.

A clamping block 670 is shown disposed against the membrane card 650 along the sloping surface 622. The clamp 670 includes a block 672, and there is a sloping surface 674 on the block 672. The sloping surface 674 generally matches the sloping surface 622 of the base element 602.

A pressure plate 676 and an insulator 678 are disposed between the sloping surface 674 of the block 672 and the probe card 650. The insulator 678 is disposed against the conductive traces 654, and the pressure 676 is disposed between the insulator layer 678 and the sloping surface 674. The pressure plate 676 allows pressure to be uniformly be placed on the membrane card 650 along the sloping surface 622, and the insulator 678 provides the necessary dielectric layer and protective layer for the conductive trace(s) 654. The clamp 670 is appropriately secured to the base element 602.

A portion of the printed circuit board 690 is shown disposed against the membrane card 650 and against the base element 602. The printed circuit board includes electrical circuit 692 on the top or upper surface of the board 690. The electrical circuitry 692 is shown in electrical contact with the trace 654 of the membrane card 650. This is substantially the same as disclosed above, in FIGS. 3 and 8.

In the embodiments of FIGS. 1–8, discussed in detail above, there is an insert in the cutout portions of the base elements, and it is the insert that applies downward force on the needles of the probe cards to bias the needles against an integrated circuit under tab. In the embodiment of FIG. 9, the need for the insert is obviated and the base element itself provides a downward force to bias the needles against a circuit under tab. The clamp holds the probe or membrane card against the base element and the base element is then appropriately lowered against a circuit under test, as discussed above, and it is the base element 602, primarily through its sloping side 622, that causes the needle(s) 656 to contact an integrated circuit under test.

will be noted that in FIGS. 5 and 6 a single probe card is shown with four quadrants of metallic traces and needle elements. It will be understood that a probe card may be fabricated of four separate quadrants of metallic traces and needles, if desired. The latter design may be especially applicable or desirable for the embodiment of FIG. 9. In the embodiment of FIG. 9, four separate clamp elements may be used, with a separate clamp element for each membrane quadrant.

While only single metal layer membrane cards are shown in the drawing and discussed in the specification above, it will be understood that multilayer membrane cards, having a metal layer ground plane for impedance control, may be used.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What I claim is:

1. Probe card apparatus securable to a printed circuit board for testing integrated circuits on a wafer, comprising, in combination:

base element means, including
        a base element securable to the printed circuit board, and
        a first cutout portion having a stepped configuration in the base element;
    probe card means secured to the base element means and including
        a substrate,
        a second cutout portion aligned with the first cutout portion of the base element means,
        a plurality of conductive elements secured to the substrate, and
        a plurality of needle elements extending from the conductive elements and extending into the second cutout portion for contacting the integrated circuits on the wafer for testing purposes; and
    insert means having a stepped configuration to conform to the stepped configuration of the first cutout portion disposed in the first cutout portion in the base element means for contacting the needle elements of the probe card means to bias the needle elements against the integrated circuits for testing, including
    a third cutout portion aligned with the second cutout portion for allowing the visual alignment of the needle elements and the integrated circuits for testing, and
    fulcrum means for contacting the needle elements for biasing the needle elements against the integrated circuits for testing.

2. The apparatus of claim 1 in which the base element means further includes means for securing the insert means in the first cutout portion.

3. The apparatus of claim 2 in which the means for securing the insert means in the first cutout portion includes a top plate secured to the base element.

4. The apparatus of claim 3 in which the base element means further includes means for adjusting the location of the insert means relative to the probe card means.

5. The apparatus of claim 4 in which the means for adjusting the location of the insert means relative to the probe card means includes first set screw means for adjusting the insert means relative to the top plate.

6. The apparatus of claim 5 in which the means for adjusting the location of the insert means relative to the probe card means further includes second set screw means for adjusting the insert means relative to the base element.

7. The apparatus of claim 1 in which the plurality of needle elements extend downwardly from the conductive elements at an acute angle toward the integrated circuits to be tested for providing a scrubbing action between the needle elements and the integrated circuits when the needle elements are biased against the integrated circuits by the fulcrum means of the insert means.

8. The apparatus of claim 7 in which the acute angle is between about zero degrees and about forty five degrees.

9. The apparatus of claim 1 in which the base element means further includes means for varying the orientation of the base element with respect to the printed circuit board.

10. The apparatus of claim 1 in which the insert means comprises a dielectric block.

11. The apparatus of claim 1 in which the fulcrum means includes a non-conductive portion for contacting the needle elements.

12. The apparatus of claim 1 in which the probe card means is releasably secured to the base element means.

13. The apparatus of claim 1 in which the fulcrum means includes resilient means for contacting the needle elements.

14. The apparatus of claim 1 in which the base element means further includes an inner planar bottom surface adjacent to the first cutout portion, and an outer planar bottom surface remote from the inner planar bottom surface.

15. The apparatus of claim 14 in which the probe card means is adhesively secured to the inner planar bottom surface.

16. The apparatus of claim 14 in which the base elements means is secured to the printed circuit board at the outer planar bottom surface.

17. The apparatus of claim 16 in which the base element means further includes resilient means disposed between the outer planar bottom surface and the printed circuit board.

18. The apparatus of claim 14 in which the base elements means further includes tapered surfaces extending between the outer planar bottom surface and the inner planar bottom surface.

19. Probe card apparatus for testing integrated circuits, comprising, in combination:

base element means, including
        a base element, and
        a first cutout portion having a stepped configuration extending through the base element;
    probe card means secured to the base element means, including
        a membrane,
        a second cutout portion in the membrane aligned with the first cutout portion in the base element, and
        a plurality of conductive elements on the membrane and extending into the second cutout portion for contacting the integrated circuits for testing; and
    insert means conforming to the stepped configuration of the first cutout portion disposed in the first cutout portion and adjustable therein for contacting the conductive elements to bias the conductive elements against the integrated circuits for testing.

20. The apparatus of claim 19 in which the insert means includes a third cutout portion aligned with the first and second cutout portions for visually aligning the conductive elements and the integrated circuits.

21. The apparatus of claim 19 in which the insert means comprises a dielectric block.

22. The apparatus of claim 19 in which the base element means further includes means for aligning the probe card means to the base element.

23. The apparatus of claim 22 in which the means for aligning the probe card means to the base element includes pins extending from the base element and holes in the membrane for receiving the pins.

24. The apparatus of claim 19 in which the base element means further includes a generally flat bottom surface extending outwardly from the first cutout portion.

25. The apparatus of claim 24 in which the probe card means is releasably secured to the generally flat bottom surface.

\* \* \* \* \*